United States Patent [19]
Liu et al.

[11] Patent Number: 6,121,063
[45] Date of Patent: Sep. 19, 2000

[54] METHOD OF TESTING A BALL GRID ARRAY IC

[75] Inventors: Hermen Liu, Taoyuan Hsien; Gino J. F. Shian, Hsinchu, both of Taiwan

[73] Assignee: United Microelectronics Corp., Hsinchu, Taiwan

[21] Appl. No.: 09/124,876

[22] Filed: Jul. 30, 1998

[30] Foreign Application Priority Data

Jun. 18, 1998 [TW] Taiwan ................................. 87109767

[51] Int. Cl.[7] ........................... H01L 21/66; G01R 31/26
[52] U.S. Cl. ................................................ 438/15; 438/14
[58] Field of Search ....................... 438/15, 14; 428/601, 428/620, 602; 324/754; 257/690

[56] References Cited

U.S. PATENT DOCUMENTS 5,807,493  9/1998  Maki et al. .............................. 216/106
5,998,228  12/1999 Eldridge et al. ........................... 438/15

OTHER PUBLICATIONS

Electronic Packaging and Interconnection Handbook; Charles A. Harper; 1997;pp 10.22–10.33.

*Primary Examiner*—Richard Elms
*Assistant Examiner*—Bradley K Smith
*Attorney, Agent, or Firm*—Thomas, Kayden, Horstemeyer & Risley

[57] ABSTRACT

A method of testing a ball grid array (BGA) integrated circuit (IC) package such that no solder balls are attached to the BGA IC package when burn-in testing using a burn-in testing socket is carried out. In this method, landings on the substrate of the BGA IC package directly contact the test contacts of the burn-in testing socket. Furthermore, the substrate of the BGA IC package is cleaned with hydrogen peroxide solution before solder balls are attached onto the landings of the BGA IC substrate.

22 Claims, 3 Drawing Sheets

METHOD OF TESTING A BALL GRID ARRAY IC

CROSS-REFERENCE TO RELATED APPLICATION

This application claims the priority benefit of Taiwan application serial no. 87109767, filed Jun. 18, 1998, the full disclosure of which is incorporated herein by reference.

BACKGROUND OF THE INVENTION

1. Field of Invention

The present invention relates to a method of testing semiconductor integrated circuits (ICs). More particularly, the present invention relates to a method of testing a ball grid array (BGA) IC package.

2. Description of Related Art

Ball grid array integrated circuit (BGA IC) represents new generations of a method of high pin count IC packaging. BGA IC is suitable for packaging ultra-large scale integration (ULSI) chips having sub-micron resolution. As integrated circuits become functionally more powerful, the number of output pins demanded by each silicon chip increases, too. Conventional packaging methods such as quad flat pack (QFP) or pin-grid array (PGA) are gradually unable to provide a greater number of pin counts. Common QFP or PGA packages these days can provide from over a hundred to about two hundred IC leads. However, a current logic IC chip may demand more than three hundred leads.

For example, the core logic of a 64-bit microprocessor based personal computer must be capable of connecting the microprocessor with system memories such as DRAM or flash SRAM through a fill 64-bit wide bus. If the core logic circuit is fabricated on an IC chip, data bus and address bus output from the IC chip must occupy at least two hundred pins. Together with other controlling signal leads, more than three hundred pins are often necessary for packaging the chip. Hence, only a BGA IC type of packaging is capable of satisfying the high pin count requirements.

FIG. 1 is a flow diagram showing the conventional testing procedure of a BGA IC package. As shown in FIG. 1, conventional BGA IC packages are tested following the sequence from steps (a) through (e).

In step (a), a BGA IC package 100 having no attached solder balls is provided. In other words, substrate 102 of the BGA IC package 100 does not have any solder balls attached. In FIG. 1, the silicon chip is labeled 101 while the landings on the substrate for making electrical contact are labeled 103.

In step (b), solder balls 104 are attached to the landings 103 on the substrate 102 of the BGA IC package 100.

In step (c), the BGA IC package 100 having attached solder balls 104 is mounted onto a burn-in (B/I) test socket 105. During the B/I testing, the solder balls 104 must remain attached to test contacts 106 of the B/I test socket 105.

In step (d), the BGA IC package 100 having attached solder balls 104 is transferred to a final test socket 107 for final testing. During the final testing, the solder balls 104 must also remain attached to test contacts 108 of the final test socket 107.

Finally, in step (e), when testing shows no defects in the chip, the BGA IC package 100 is mounted onto a printed circuit board (PCB) 109 by using a surface mount technique.

In the aforementioned BGA IC testing method, the test contacts 106 within the B/I test socket 105 must attach to the solder balls 104. However, during burn-in testing, a lot of heat is generated, and hence the following defects are produced:

1. Solder balls may be damaged resulting in defective soldering joints when the BGA IC package is mounted onto a PCB.
2. Some solder may melt and stick on the point of attachment of the test contacts. Hence, the working life of the B/I test socket may be shortened.

In light of the foregoing, there is a need to provide an improved method of testing the chip inside a BGA IC package.

SUMMARY OF THE INVENTION

Accordingly, the present invention provides a method of testing a BGA IC package such that no solder balls are attached when burn-in testing of the BGA IC is carried out. Hence, test contacts in the testing socket will not directly contact the solder balls.

To achieve these and other advantages and in accordance with the purpose of the invention, as embodied and broadly described herein, the invention provides a method of testing a BGA IC package. The method includes the steps of providing a BGA IC package having no attached solder balls, and then carrying out a burn-in testing. Next, solder balls are attached to the BGA IC package, and a final testing is carried out. Finally, the BGA IC package is mounted onto a printed circuit board.

In another aspect, the invention provides a method of testing BGA IC package. The method includes the steps of providing a BGA IC package having no attached solder balls, and then carrying out a burn-in testing. Next, a final testing of the BGA IC package is carried out. Thereafter, solder balls are attached to the BGA IC package. Finally, the BGA IC package is mounted onto a printed circuit board.

In one further aspect, the invention provides a method of testing a BGA IC package. The method includes the steps of providing a BGA IC package having no attached solder balls, and then mounting the BGA IC package onto a burn-in testing socket to carry out the burn-in testing. Next, the substrate of the BGA IC package is cleaned before attaching solder balls to the substrate. Subsequently, the BGA IC package is mounted onto a final testing socket to carry out the final testing. Finally, the BGA IC package is mounted onto a printed circuit board after the package is judged to be free from defects.

In yet another aspect, the invention provides a method of testing a BGA IC package. The method includes the steps of providing a BGA IC package having no attached solder balls, and then mounting the BGA IC package onto a burn-in testing socket to carry out the burn-in testing. Next, the BGA IC package is mounted onto a final testing socket to carry out the final testing. Subsequently, the substrate of the BGA IC package is cleaned before attaching solder balls to the substrate. Finally, the BGA IC package is mounted onto a printed circuit board after the package is judged to be free from defects.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
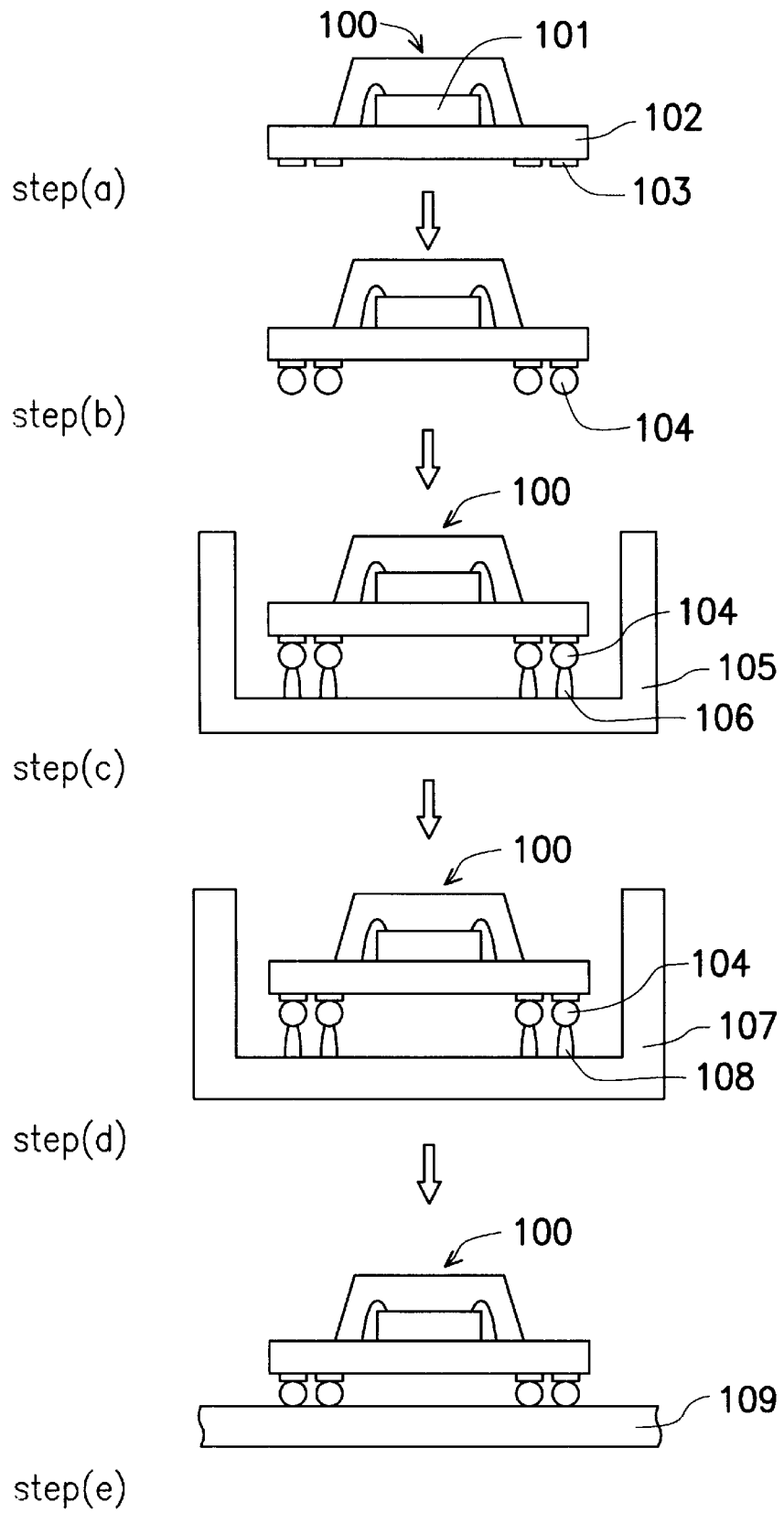
FIG. 1 is a flow diagram showing the conventional testing procedure of a BGA IC package.

Reference will now be made in detail to the present preferred embodiments of the invention, examples of which are illustrated in the accompanying drawings. Wherever possible, the same reference numbers are used in the drawings and the description to refer to the same or like parts.

The BGA IC testing method of this invention is to carry out the B/I testing without any attached solder balls on the BGA IC package. Therefore, test contacts in a testing socket have to make direct contact with the landings on the BGA IC substrate.

Figure 2:
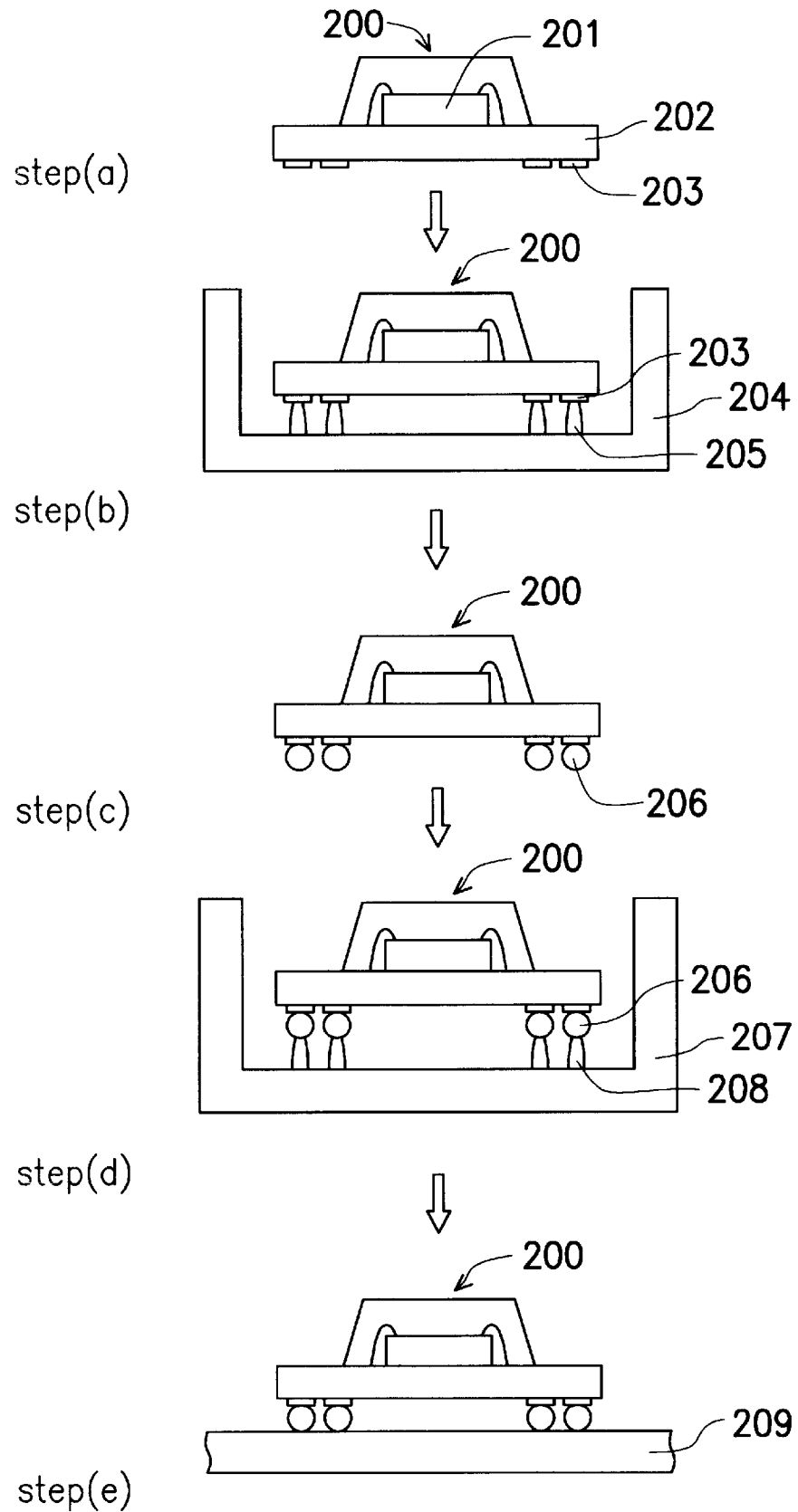
FIG. 2 is a flow diagram showing the testing procedure of a BGA IC package according to a first embodiment of this invention.

FIG. 2 is a flow diagram showing the testing procedure of a BGA IC package according to a first embodiment of this invention. The method of testing a BGA IC package according to the first preferred embodiment of this invention includes the following steps.

In step (a), a BGA IC package 200 having no attached solder balls is provided. In other words, no solder balls are attached to the substrate 202 of the BGA IC 200, yet. The silicon chip is labeled 201, and the landings on the substrate are labeled 203. The BGA IC package 200 can be a plastic ball grid array (PBGA) IC, thermal enhanced BGA (EBGA) IC, ceramic BGA (CBGA) IC, tape BGA (TBGA) IC or flip-chip BGA (FCBGA)IC.

In step (b), the BGA IC package 200 is mounted onto a B/I testing socket 204, and then a B/I testing is carried out. When the BGA IC package 200 is undergoing the B/I testing, the landings 203 on the substrate 202 of the BGA IC package 200 directly contact the test contacts 205 of the B/I testing socket 204.

In step (c), hydrogen peroxide solution is used to clean the substrate 202 of the BGA IC package 200. Thereafter, solder balls 206 are attached to the landings 203 on the substrate 202 of the BGA IC package 200.

In step (d), the solder balls attached BGA IC package 200 is mounted onto a final testing socket 207 to carry out a final testing. When the BGA IC package 200 is undergoing the final testing, solder balls 206 directly contact the test contacts 208 of the final testing socket 207.

In step (e), the BGA IC package 200 is mounted onto a printed circuit board 209 if the package is found to be free from defects.

In summary, the testing procedure in the first embodiment of this invention includes: (1) providing a BGA IC package having no solder balls; (2) carrying out a B/I testing; (3) attaching solder balls to the BGA IC package; (4) carrying out a final testing; and (5) mounting the BGA IC package onto a PCB.

Without attached solder balls on the BGA IC package when the B/I testing is carried out, the test contacts have to directly contact the landings on the substrate of the BGA IC. Consequently, solder balls will remain intact and none of the tin from the solder balls will be transferred to the testing contacts. Hence, reliability of connectivity of the solder balls, testing yield and working life of testing sockets will all be improved.

Figure 3:
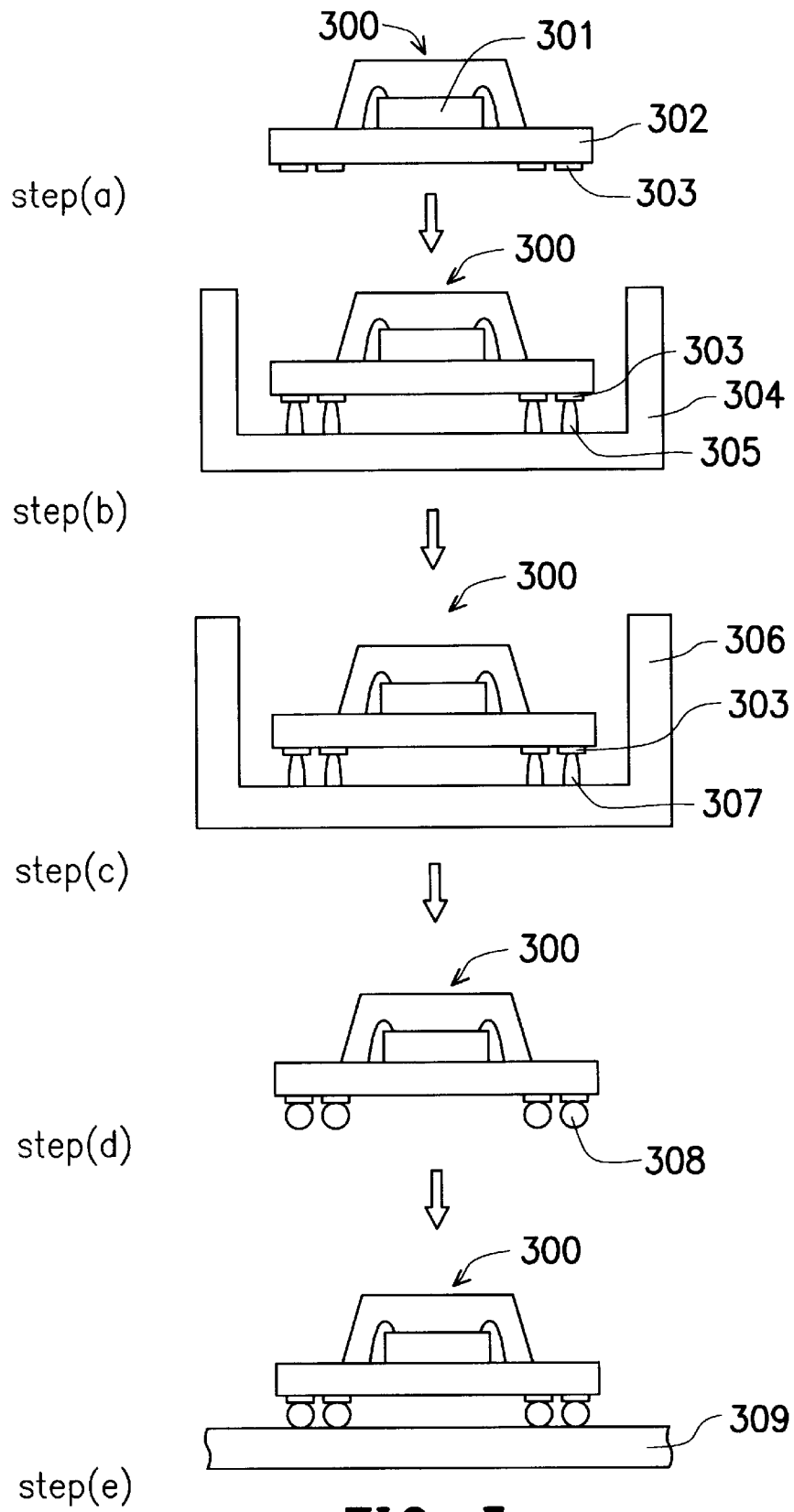
FIG. 3 is a flow diagram showing the testing procedure of a BGA IC package according to a second embodiment of this invention.

FIG. 3 is a flow diagram showing the testing procedure of a BGA IC package according to a second embodiment of this invention. The method of testing a BGA IC package according to the second preferred embodiment of this invention includes the following steps.

In step (a), a BGA IC package 300 having no attached solder balls is provided. In other words, no solder balls are attached to the substrate 302 of the BGA IC 300, yet. The silicon chip is labeled 301, and the landings on the substrate are labeled 303. The BGA IC package 300 can be PBGA IC, EBGA IC, CBGA IC, TBGA IC or FCBGA IC.

In step (b), the BGA IC package 300 is mounted onto a B/I testing socket 304, and then a B/I testing is carried out. When the BGA IC package 300 is undergoing the B/I testing, the landings 303 on the substrate 302 of the BGA IC package 300 directly contact the test contacts 305 of the B/I testing socket 304.

In step (c), the BGA IC package 300 is mounted onto a final testing socket 306 to carry out a final testing. When the BGA IC package 300 is undergoing the final testing, the landings 303 on the substrate 302 of the BGA IC package 300 directly contact the test contacts 307 of the final testing socket 306.

In step (d), hydrogen peroxide solution is used to clean the substrate 302 of the BGA IC package 300. Thereafter, solder balls 308 are attached to the landings 303 on the substrate 302 of the BGA IC package 300.

In step (e), the BGA IC package 300 is mounted onto a printed circuit board 309 if the package is found to be free of defects.

In summary, the testing procedure in the second embodiment of this invention includes: (1) providing a BGA IC package having no solder balls; (2) carrying out a B/I testing; (3) carrying out a final testing; (4) attaching solder balls to the BGA IC package; and (5) mounting the BOA IC package onto a PCB.

Without attached solder balls on the BGA IC package when the B/I testing and the final testing are carried out, the test contacts have to directly contact the landings on the substrate of the BGA IC. Consequently, solder balls will remain intact and none of the tin from the solder balls will be transferred to the testing contacts. Hence, reliability of connectivity of the solder balls, testing yield and working life of testing sockets will all be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of testing a ball grid array (BGA) integrated circuit (IC) package, the method comprising the steps of:

providing a BGA IC package having no attached solder balls;

performing a burn-in testing;

attaching solder balls to the BGA IC package;

performing a final testing; and mounting the BGA IC package onto a printed circuit board (PCB).

2. The method of claim 1, wherein the BGA IC package can be any one of the IC packages that include plastic ball grid array (PBGA) IC, thermal enhanced BGA (EBGA) IC, ceramic BGA (CBGA) IC, tape BGA (TBGA) IC and flip-chip BGA (FCBGA) IC.

3. The method of claim 1, wherein before the step of attaching solder balls onto the BGA IC package, further includes cleaning the substrate of the BGA IC package.

4. The method of claim 3, wherein the step of cleaning the substrate of a BGA IC package includes using hydrogen peroxide solution.

5. The method of claim 1, wherein the step of mounting the BGA IC package onto a PCB includes a surface mount technique.

6. A method of testing a ball grid array (BGA) integrated circuit (IC) package, the method comprising the steps of:

providing a BGA IC package having no attached solder balls;

performing a burn-in testing;

performing a final testing;

attaching solder balls to the BGA IC package; and mounting the BGA IC package onto a printed circuit board (PCB).

7. The method of claim 6, wherein the BGA IC package can be any one of the IC packages that include plastic ball grid array (PBGA) IC, thermal enhanced BGA (EBGA) IC, ceramic BGA (CBGA) IC, tape BGA (TBGA) IC and flip-chip BGA (FCBGA) IC.

8. The method of claim 6, wherein before the step of attaching solder balls onto the BGA IC package, further includes cleaning the substrate of the BGA IC package.

9. The method of claim 8, wherein the step of cleaning the substrate of a BGA IC package includes using hydrogen peroxide solution.

10. The method of claim 6, wherein the step of mounting the BGA IC package onto a PCB includes a surface mount technique.

11. A method of testing ball grid array (BGA) integrated circuit (IC) package, comprising the steps of:

providing a BGA IC package having no attached solder balls;

mounting the BGA IC package onto a burn-in testing socket and then performing a burn-in testing;

cleaning the substrate of the BGA IC package;

attaching solder balls onto the substrate of the BGA IC package;

mounting the BGA IC package onto a final testing socket and then performing a final testing; and mounting the BGA IC package onto a printed circuit board (PCB) if the BGA IC is found to be defects free.

12. The method of claim 11, wherein the BGA IC package can be any one of the IC packages that include plastic ball grid array (PBGA) IC, thermal enhanced BGA (EBGA) IC, ceramic BGA (CBGA) IC, tape BGA (TBGA) IC and flip-chip BGA (FCBGA) IC.

13. The method of claim 11, wherein landings on the substrate of the BGA IC directly contact the test contacts of the burn-in testing socket when burn-in testing is carried out.

14. The method of claim 11, wherein the step of cleaning the substrate of a BGA IC package includes using hydrogen peroxide solution.

15. The method of claim 11, wherein solder balls on the substrate of the BGA IC contact the test contacts of the final testing socket when the final testing is carried out.

16. The method of claim 11, wherein the step of mounting the BGA IC package onto a PCB includes a surface mount technique.

17. A method of testing ball grid array (BGA) integrated circuit (IC) package, comprising the steps of:

providing a BGA IC package having no attached solder balls;

mounting the BGA IC package onto a burn-in testing socket and then performing a burn-in testing;

mounting the BGA IC package onto a final testing socket and then performing a final testing;

cleaning the substrate of the BGA IC package;

attaching solder balls onto the substrate of the BGA IC package; and mounting the BGA IC package onto a printed circuit board (PCB) if the BGA IC is found to be free of defects.

18. The method of claim 17, wherein the BGA IC package can be any one of the IC packages that include plastic ball grid array (PBGA) IC, thermal enhanced BGA (EBGA) IC, ceramic BGA (CBGA) IC, tape BGA (TBGA) IC and flip-chip BGA (FCBGA) IC.

19. The method of claim 17, wherein landings on the substrate of the BGA IC directly contact the test contacts of the burn-in testing socket when burn-in testing is carried out.

20. The method of claim 17, wherein landings on the substrate of the BGA IC directly contact the test contacts of the final testing socket when the final testing is carried out.

21. The method of claim 17, wherein the step of cleaning the substrate of a BGA IC package includes using hydrogen peroxide solution.

22. The method of claim 17, wherein the step of mounting the BGA IC package onto a PCB includes a surface mount technique.

* * * * *